US012057619B2

(12) United States Patent
Jeon et al.

(10) Patent No.: US 12,057,619 B2
(45) Date of Patent: Aug. 6, 2024

(54) ELECTRONIC DEVICE HAVING SIDE KEY COMPRISING ANTENNA

(71) Applicant: Samsung Electronics Co., Ltd., Suwon-si (KR)

(72) Inventors: Seunggil Jeon, Suwon-si (KR); Wonjoon Choi, Suwon-si (KR); Seongbeom Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 472 days.

(21) Appl. No.: 17/424,375

(22) PCT Filed: Jan. 21, 2020

(86) PCT No.: PCT/KR2020/000978
§ 371 (c)(1),
(2) Date: Jul. 20, 2021

(87) PCT Pub. No.: WO2020/153694
PCT Pub. Date: Jul. 30, 2020

(65) Prior Publication Data
US 2022/0069443 A1  Mar. 3, 2022

(30) Foreign Application Priority Data

Jan. 25, 2019  (KR) .................. 10-2019-0009990

(51) Int. Cl.
*H01Q 1/24* (2006.01)
*H04B 1/3827* (2015.01)
(Continued)

(52) U.S. Cl.
CPC .......... *H01Q 1/243* (2013.01); *H04B 1/3838* (2013.01); *H04M 1/0249* (2013.01); *H04M 1/0277* (2013.01); *H04M 1/236* (2013.01)

(58) Field of Classification Search
CPC ... H01Q 1/243; H04B 1/3838; H04M 1/0249; H04M 1/0277; H04M 1/236
See application file for complete search history.

(56) References Cited

U.S. PATENT DOCUMENTS 8,270,255 B2   9/2012   Cuschieri et al.
8,797,211 B2   8/2014   Valdes-Garcia
(Continued)

FOREIGN PATENT DOCUMENTS

CN           108234718 A      6/2018
KR    10-2002-0040893 A      5/2002
(Continued)

OTHER PUBLICATIONS

Korean Office Action with English translation dated Feb. 6, 2023; Korean Appln. No. 10-2019-0009990.
(Continued)

*Primary Examiner* — Junpeng Chen
(74) *Attorney, Agent, or Firm* — Jefferson IP Law, LLP

(57) ABSTRACT

Provided is an electronic device including a conductive housing including a first face facing a first direction, a second face facing a second direction opposite to the first direction, and a lateral face surrounding at least part of a space constructed between the first face and the second face, a printed circuit board seated inside the housing, and a side key fastened to an edge region of the housing, wherein the side key include a button portion of which one face covers a first through-hole constructed on the lateral face and the other face is exposed to the outside, an actuation portion extending from the face of the button portion covering the first through-hole towards the inside of the housing in such a manner that at least part of the extending portion is inserted to the first through-hole and at least part of the inserted portion moves in a third direction parallel to a normal direction of the lateral face of the housing according to (Continued)

whether the button portion is pressed, a side key circuit board including an outer contact portion pressed by a movement of the actuation portion and an inner contact portion which is in contact with the outer contact portion according to whether the outer contact portion is pressed, and including a switch module which produces an electric signal due to the contact of the outer contact portion and the inner contact portion, a side key bracket on which at least part of the side key circuit board is seated and which fixes and supports the side key circuit board, and an antenna which uses the first through-hole as an antenna aperture for transmitting/receiving radio waves. In addition thereto, various embodiments understood through this document are possible.

18 Claims, 17 Drawing Sheets

(51) Int. Cl.
*H04M 1/02* (2006.01)
*H04M 1/23* (2006.01)

(56) References Cited

U.S. PATENT DOCUMENTS

| | | | |
|---|---|---|---|
| 2008/0074329 A1* | 3/2008 | Caballero | H01Q 1/088 |
| | | | 343/702 |
| 2010/0232122 A1 | 9/2010 | Chen | |
| 2011/0255260 A1* | 10/2011 | Weber | H01H 13/04 |
| | | | 200/341 |
| 2016/0028148 A1 | 1/2016 | Tan et al. | |
| 2017/0213665 A1 | 7/2017 | Weber et al. | |
| 2017/0245376 A1* | 8/2017 | Song | H05K 5/0008 |

FOREIGN PATENT DOCUMENTS

| | | |
|---|---|---|
| KR | 10-0785355 B1 | 12/2007 |
| KR | 10-1464099 B1 | 11/2014 |
| KR | 10-2016-0045643 A | 4/2016 |
| KR | 20-2016-0003858 U | 11/2016 |
| KR | 10-2017-0099626 A | 9/2017 |

OTHER PUBLICATIONS

Korean Notice of Patent Grant dated Aug. 24, 2023, issued in Korean Application No. 10-2019-0009990.

* cited by examiner

ELECTRONIC DEVICE HAVING SIDE KEY COMPRISING ANTENNA

TECHNICAL FIELD

Various embodiments of the disclosure relate to an electronic device having a side key including an antenna.

BACKGROUND ART

An electronic device such as a smartphone or the like may provide various functions such as a telephony function, a multimedia file playback function, or the like. A side key may be disposed on one side surface of the electronic device to provide a function such as a telephone volume control, a multimedia file playback volume control, a screen on/off, or the like while the aforementioned function is performed.

When a button portion exposed to the outside is pressed, the side key presses an outer contact portion while an actuation portion coupled to the button portion moves towards the inside of the electronic device, and a key input signal may be produced due to an electrical contact of the outer contact portion and an inner contact portion. In addition, the produced key input signal may be transferred to a processor mounted on a main printed circuit board to perform a function related to an input of the side key.

Meanwhile, an electronic device having a communication function may include an antenna. Although the antenna is generally located inside a housing of the electronic device, the antenna may be disposed to an outermost portion inside the housing by considering a mounting space of other electronic components.

DISCLOSURE OF INVENTION

Technical Problem

In case of the antenna disposed inside the housing, the housing may cause a problem in that radiation efficiency deteriorates. In addition, an electronic device which tends to be light, thin, short, and small to facilitate portability may have difficulty in securing a space of disposing the antenna. In particular, in an electronic device which requires an antenna for communication of a new frequency band (e.g., a 5th Generation (5G) frequency band), there is a need for a method of designing a space for disposing an antenna by considering interference between antennas and an antenna disposition space for communication of the existing frequency band.

Various embodiments of the disclosure may provide an electronic device having an antenna disposition structure utilizing a space for disposing a side key.

In addition, various embodiments of the disclosure may provide an electronic device having a shielding structure applied to an opening portion required to place a side key.

Solution to Problem

An electronic device according to various embodiments of the disclosure may include a conductive housing including a first surface facing a first direction, a second surface facing a second direction opposite to the first direction, and a side surface surrounding at least part of a space between the first surface and the second surface, a printed circuit board seated inside the housing, and a side key fastened to an edge region of the housing. The side key may include a button portion of which one surface covers a first through-hole formed on the side surface and another surface is exposed to the outside, an actuation portion extending from the surface of the button portion covering the first through-hole towards the inside of the housing in such a manner that at least part of the extending portion is inserted to the first through-hole and at least part of the inserted portion moves in a third direction parallel to a normal direction of the side surface of the housing according to whether the button portion is pressed, a side key circuit board including an outer contact portion pressed by a movement of the actuation portion, an inner contact portion which is in contact with the outer contact portion according to whether the outer contact portion is pressed, and a switch module which produces an electric signal due to the contact of the outer contact portion and the inner contact portion, a side key bracket on which at least part of the side key circuit board is seated and which fixes and supports the side key circuit board, and an antenna which uses the first through-hole as an antenna aperture for transmitting/receiving radio waves.

Advantageous Effects of Invention

According to various embodiments of the disclosure, since an antenna is disposed to a space for disposing a side key, a space for mounting other electronic components can be secured, and interference with the existing other antennas can be minimized.

In addition, according to various embodiments of the disclosure, since an antenna is disposed to a space for disposing a side key, a through-hole for the side key can be utilized as an antenna aperture for transmitting and receiving radio waves of the antenna.

In addition, according to various embodiments of the disclosure, since a shielding structure is applied to an opening portion required to place a side key, a null problem of an antenna radiation pattern can be solved.

In addition thereto, various effects which are directly or indirectly understood through this document may be provided.

BRIEF DESCRIPTION OF DRAWINGS

The same or similar reference numerals in the drawings may be used for the same or similar components.

BEST MODE FOR CARRYING OUT THE INVENTION

Figure 1:
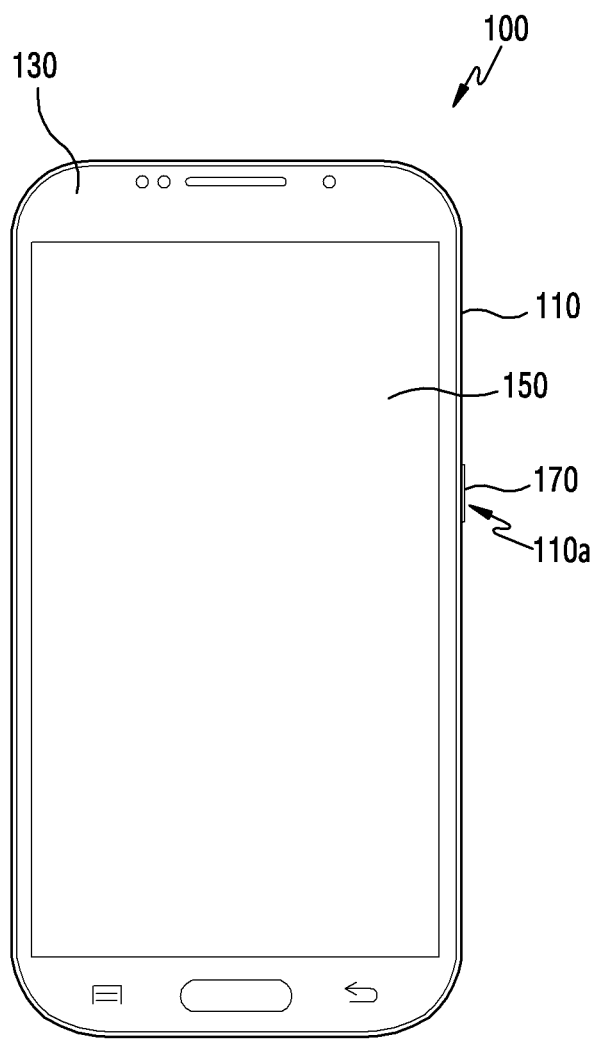
FIG. 1 illustrates an electronic device according to an embodiment of the disclosure.

Hereinafter, various embodiments of the disclosure will be described in detail with reference to the accompanying drawings. Components shown in the drawings may be exaggerated or reduced in size for convenience of explanation, and the disclosure is not necessarily limited thereto.

FIG. 1 illustrates an electronic device according to an embodiment of the disclosure.

Referring to FIG. 1, an electronic device 100 may include a housing 110, a front cover 130, a display 150, and a side key 170. The housing 110 may fix or support internal components (e.g., the display 150, a printed circuit board (not shown), or the like) included in the electronic device 100. For example, the printed circuit board on which a processor, a memory, a communication module, or the like is mounted may be fixed by being seated inside the housing 110. At least part of the housing 110 may include a conductive material.

The housing 110 may include a front surface, a back surface, and a side surface surrounding at least part of a space between the front surface and the back surface. The side surface refers to a surface which is visually viewed when watching a thin surface of the electronic device. The front surface refers to a surface on which a screen output through the display 150 is exposed to the outside as a region except for the side surface. The back surface refers to a surface opposite to the front surface. In some embodiments, part of the screen of the display 150 may be exposed to the outside through the back surface and/or the side surface, whereas unlike in the back surface and/or the side surface, most regions of the front surface may be provided to output the screen of the display 150. In addition, the housing 110 may have at least one through-hole 110a formed in some regions of the side surface, and the side key 170 may be exposed to the outside through the through-hole 110a.

The front cover 130 may constitute a front exterior of the electronic device 100, and may be coupled to the housing 110 with a space inside the housing 110 in which the internal components can be accommodated. At least some regions of the front cover 130 are formed of a transparent material (e.g., glass), and a screen output through the display 150 is displayed to the outside through a transparent region of the front cover 130.

The display 150 may display a variety of content (e.g., a text, an image, a video, an icon, a symbol, etc.) to a user. The display 150 may include a touch screen, and may receive, for example, a touch, gesture, proximity, or hovering input using an electronic pen or a user's body part.

The side key 170 may provide an interface for a user input. For example, when the user presses a button portion 171 of FIG. 2 of the side key 170, an actuation portion 173 of FIG. 2 coupled to the button portion presses an outer contact portion 175b of FIG. 3 while moving towards the inside of housing 110, and a key input signal (an electric signal) may be produced due to an electrical contact of the outer contact portion and an inner contact portion of a switch module 175a of FIG. 3. Accordingly, the electronic device 100 may perform a function related to the side key 170 in response to the produced key input signal. For example, the electronic device 100 may perform a function of a screen on/off of the display 150, a telephone volume control, a multimedia file playback volume control, or the like, in response to an input of the side key 170.

The side key 170 may be fastened to be exposed to the outside through the through-hole 110a formed on the side surface of the housing 110. Although it is shown in the figure that the side key 170 is fastened to a right edge region of the housing 110, a fastening location of the side key 170 is not limited thereto. In addition, the side key 170 may have one button portion to be pressed, or may have a plurality of button portions.

According to an embodiment, the side key 170 is placed on one side surface of the housing 710 by being disposed substantially perpendicular to a thickness direction of the electronic device 100 (e.g., a forward/backward direction of the housing 110). In order to avoid interference with the display 150 included in the electronic device 100, the side key 170 may be provided in the side surface or back surface of the display 150.

Figure 2:
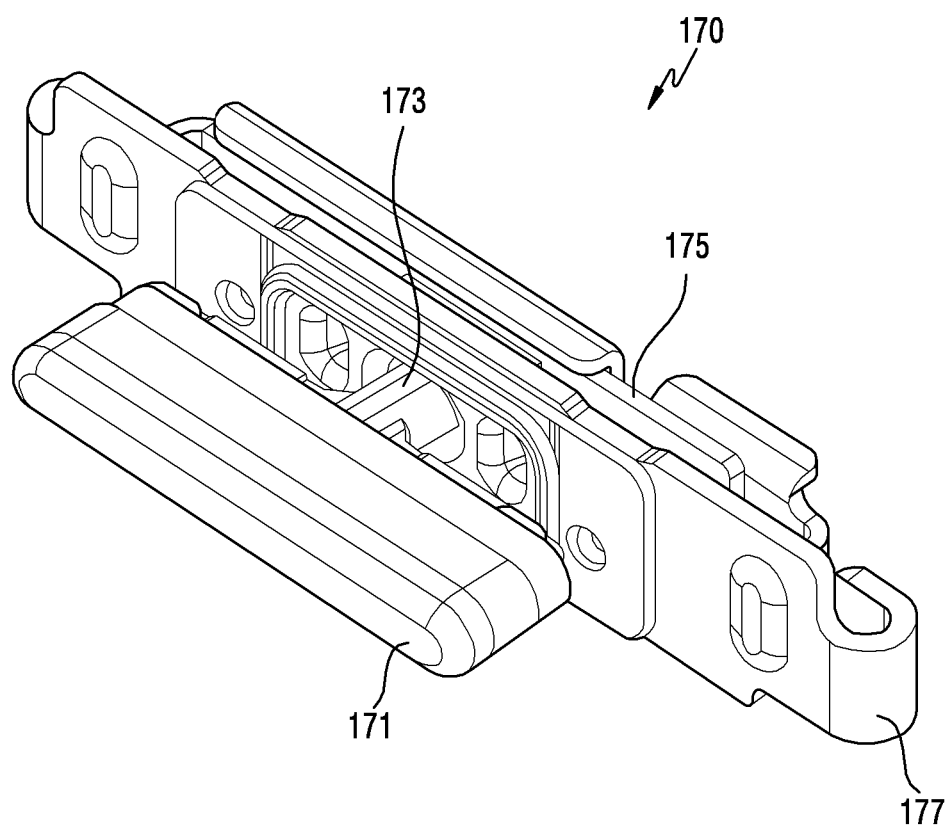
FIG. 2 illustrates a side key according to an embodiment of the disclosure.

FIG. 2 illustrates a side key according to an embodiment of the disclosure.

Referring to FIG. 2, the side key 170 may include the button portion 171, the actuation portion 173, a side key circuit board 175, and a side key bracket 177. In the button portion 171, one surface may cover the through-hole 110a formed on the side surface of the housing 110, and another surface may be exposed to the outside. Accordingly, in the button portion 171, a portion exposed to the outside may be pressed by a user.

The actuation portion 173 may extend from one surface of the button portion 171 covering the through-hole 110a towards the inside of the housing 110, and at least part of an extending portion may be inserted to the through-hole 110a. In addition, the actuation portion 173 may move in a direction parallel to a normal direction of the side surface of the housing 110 according to whether at least part of the portion inserted to the through-hole 110a is pressed by the button portion 171. For example, the actuation portion 173 may move towards the inside of the housing 110 when the button portion 171 is pressed, and may move towards the outside of the housing 110 when the pressing of the housing 110 is released.

The side key circuit board 175 may be seated and fixed to the side key bracket 177. For example, the side key bracket 177 includes a pair of support portions facing each other. The side key circuit board 175 may be seated and fixed by being inserted to a space between the support portions.

According to an embodiment, the side key circuit board 175 may include a first part seated and fixed on the side key bracket 177 and a second part extending from the first part towards the inside of the housing 110 and coupled to a main printed circuit board disposed inside the housing 110. The first part may include the outer contact portion 175b of FIG. 3 pressed by a movement of the actuation portion 173, an inner contact portion which is to be in contact with the outer contact portion according to whether the outer contact portion is pressed, and the switch module 175a of FIG. 3 which produces a key input signal due to an electrical contact of the outer contact portion and the inner contact portion. The second part may include a connection terminal which transfers the produced key input signal to the main printed circuit board.

The side key bracket 177 may provide a space in which the side key circuit board 175 can be seated, and may stably fix and support the side key circuit board 175. According to an embodiment, the side key bracket 177 may include a pair of support portions facing each other and corresponding to a length and width of the side key circuit board 175. Each of the support portions may be provided in a shape of a plate, and may be disposed by being vertically arranged in a thickness direction of the electronic device 100 so that wide surfaces (a front surface and a back surface) of the support portions face each other by being spaced apart by a specific distance from each other. In addition, the side key circuit board 175 may be inserted and seated in a space in which the wide surfaces of the support portions are spaced apart, that is, a space between the support portions. According to an embodiment, at least some regions of the side key bracket 177 may be provided with a material (e.g., a Steel Use Stainless (SUS) material) having strength greater than or equal to a specified level. For example, the support portions of the side key bracket 177 may be provided with the SUS material.

According to an embodiment, the side key bracket 177 may include a protrusion portion extending from a side surface of any one of the support portions and bent towards another support portion to extend by a specific length. The protrusion portion prevents the side key circuit board 175 seated in the space formed by the support portions from moving in the width direction of the side key bracket 177 (the thickness direction of the electronic device 100), and may prevent separation from the side key bracket 177.

The side key 170 may include an antenna. According to an embodiment, the antenna may include an antenna for communication of a 5G antenna band (e.g., 3.5 GHz, 28 GHz). The antenna may be formed of an array antenna or a patch antenna. When the antenna is formed of the array antenna, the antenna may be implemented on the side key circuit board 175. Alternatively, when the antenna is formed of the patch antenna, the antenna may be disposed on or adjacent to a front surface of the side key circuit board 175. A case where the antenna is formed of the array antenna will be described in detail with reference to FIG. 3 to FIG. 8, and a case where the antenna is formed of the patch antenna will be described in detail with reference to FIG. 9 to FIG. 12.

Figure 3:
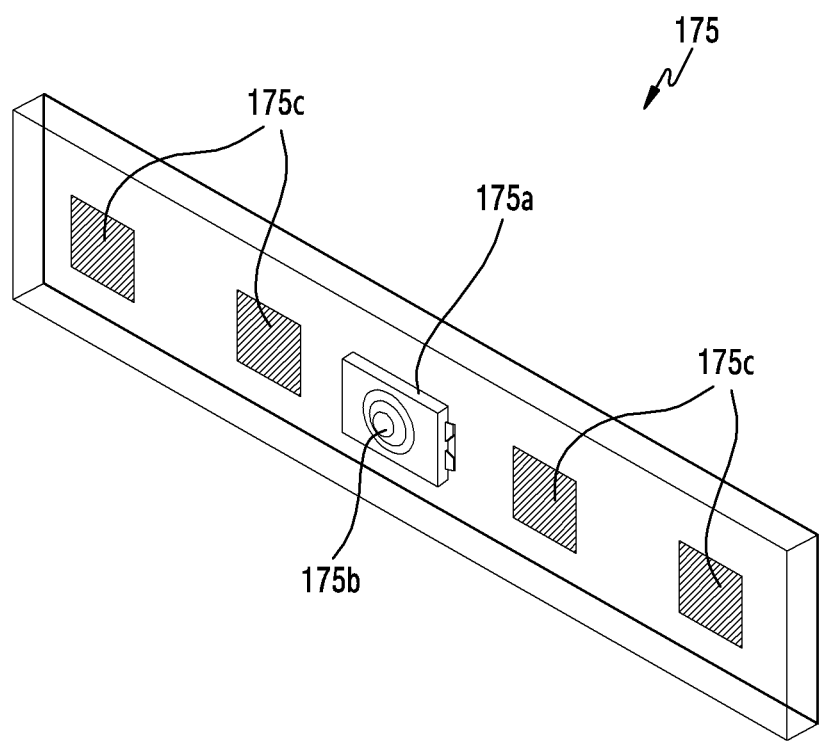
FIG. 3 illustrates part of a side key circuit board including an array antenna according to an embodiment of the disclosure.
Figure 4:
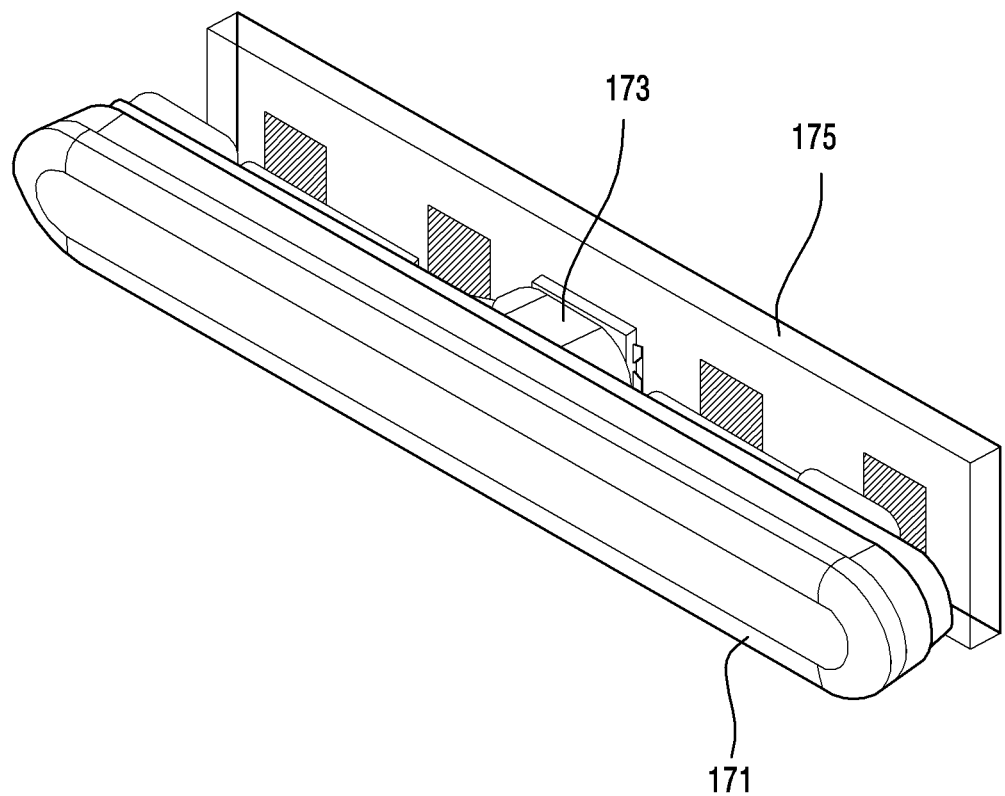
FIG. 4 illustrates part of a button portion, actuation portion, and side key circuit board of a side key according to an embodiment of the disclosure.
Figure 5:
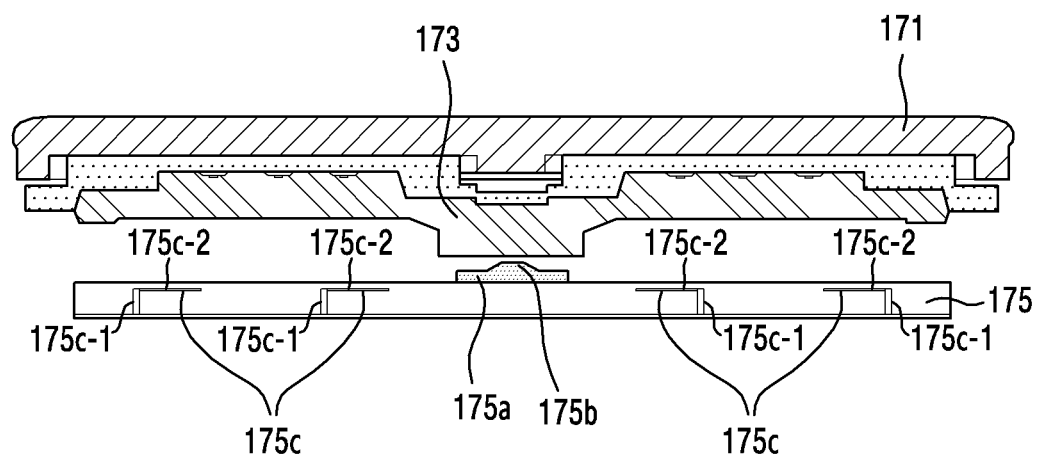
FIG. 5 is a cross-sectional view illustrating part of a structure of the side key of FIG. 4 according to an embodiment of the disclosure.

FIG. 3 illustrates part of a side key circuit board including an array antenna according to an embodiment of the disclosure. FIG. 4 illustrates part of a button portion, actuation portion, and side key circuit board of a side key according to an embodiment of the disclosure. FIG. 5 is a cross-sectional view illustrating part of a structure of the side key of FIG. 4 according to an embodiment of the disclosure.

Referring to FIG. 3 to FIG. 5, the side key circuit board 175 may include the switch module 175a, the outer contact portion 175b, and an array antenna 175c. The switch module 175a may have an inner contact portion inside thereof, and may produce an electric signal (e.g., a key input signal) when the inner contact portion is in contact with the outer contact portion 175b. According to an embodiment, the switch module 175a may be disposed to a center portion of the side key circuit board 175. The center portion of the side key circuit board 175 may include a portion located on the same line with a center of the through-hole 110a formed on a side surface of the housing 110 in a width direction of the electronic device 100 (a direction parallel with a normal direction of the side surface of the housing 110).

The outer contact portion 175b may be pressed by the actuation portion 173 of the side key 170. The outer contact portion 175b may be disposed on the switch module 175a or may be provided integrally with the switch module 175a. The outer contact portion 175b may be disposed on the same line with the center of the through-hole 110a formed on the side surface of the housing 110 in the width direction of the electronic device 110.

According to an embodiment, the outer contact portion 175b may be provided in a dome shape. For example, the outer contact portion 175b may include a hemispherical surface formed in such a manner that a surface facing the inner contact portion protrudes towards the through-hole 110a. Accordingly, the outer contact portion 175b may be in contact with the inner contact portion in such a manner that a center portion of the hemispherical surface is pressed towards the inner contact portion.

The array antenna 175c may be implemented on the side key circuit board 175. For example, a plurality of radiators 175c-2 (antenna elements) constituting the array antenna 175c may be disposed to the side key circuit board 175. According to an embodiment, the array antenna 175c may be symmetric about a center portion of the outer contact portion 175b. As a result, the array antenna 175c may be symmetric about a virtual center axis which is on the same line with the center of the through-hole 110a formed on the side surface of the housing 110 in the width direction of the electronic device 100. For example, as shown in FIG. 5, one half of the plurality of radiators 175c-2 constituting the array antenna 175c may be disposed to a left side of the side key circuit board 175 with respect to the center portion of the outer contact portion 175b, and the other half of the radiators 175c-2 may be disposed to a right side of the side key circuit board 175 with respect to the center portion of the outer contact portion 175b. In addition, a feeding portion 175c-1 of the radiator 175c-2, among the radiators 175c-2, disposed to the left side of the side key circuit board 175 with respect to the center portion of the outer contact portion 176b may be disposed to the left side, and the feeding portion 175c-1 of the radiators 175c-2, among the radiators 175c-2, disposed to a right side of the side key circuit board 175 with respect to the center portion of the outer contact portion 175b may be disposed to the right side. A separation distance of the feeding portion 175c-1 adjacent to a wiring connected to the switch module 175a included in the side key circuit board 175 may be increased.

The array antenna 175c implemented on the side key circuit board 175 may be electrically coupled to a main printed circuit board disposed inside the housing 110. For example, the array antenna 175c may be electrically coupled to a communication module mounted on the main printed circuit board through a connection terminal included in the side key circuit board 175.

Figure 6:
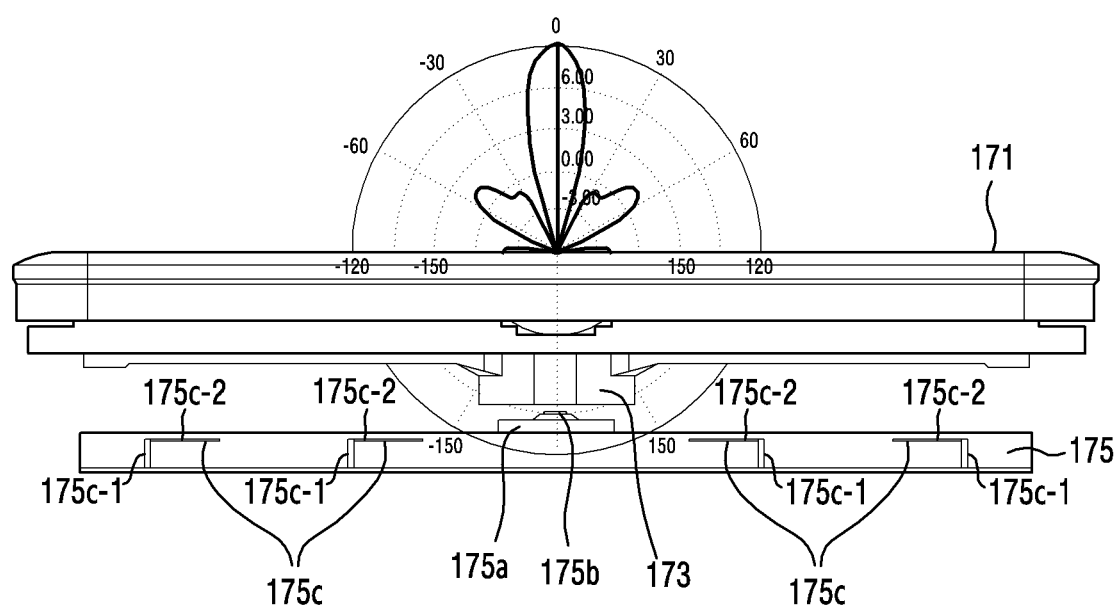
FIG. 6 is a plan view illustrating part of a structure of a side key for explaining a radiation pattern of an array antenna included in the side key according to an embodiment of the disclosure.
Figure 7:
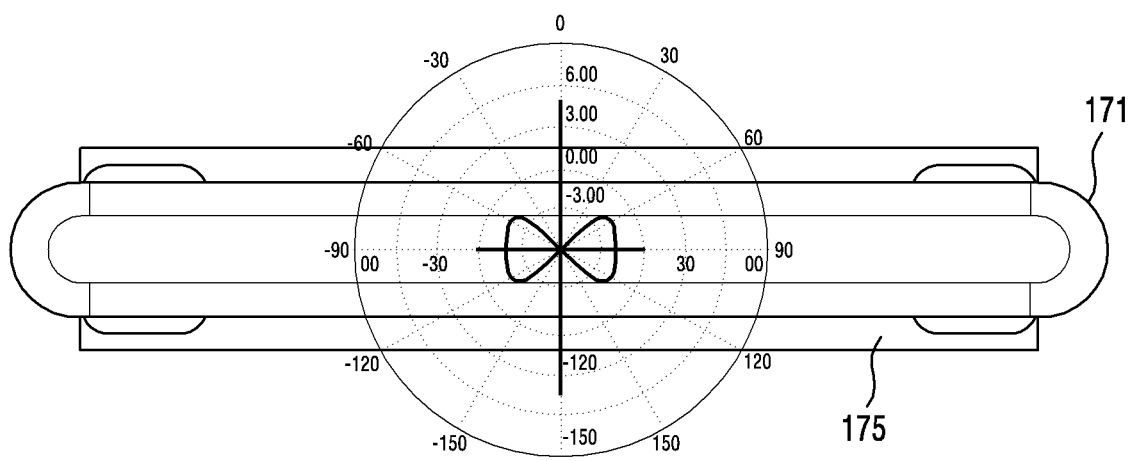
FIG. 7 is a front view illustrating part of a structure of a side key for explaining a radiation pattern of an array antenna included in the side key according to an embodiment of the disclosure.
Figure 8:
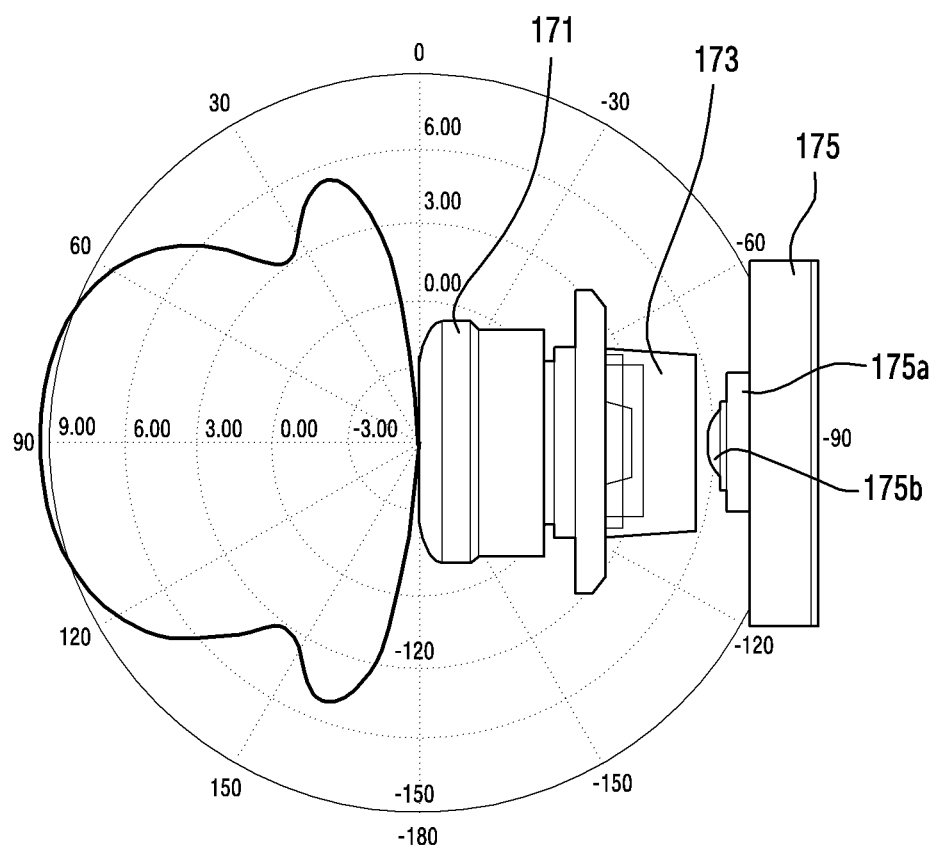
FIG. 8 is a lateral view illustrating part of a structure of a side key for explaining a radiation pattern of an array antenna included in the side key according to an embodiment of the disclosure.

FIG. 6 is a plan view illustrating part of a structure of a side key for explaining a radiation pattern of an array antenna included in the side key according to an embodiment of the disclosure. FIG. 7 is a front view illustrating part of a structure of a side key for explaining a radiation pattern of an array antenna included in the side key according to an embodiment of the disclosure. FIG. 8 is a lateral view illustrating part of a structure of a side key for explaining a radiation pattern of an array antenna included in the side key according to an embodiment of the disclosure.

Referring to FIG. 6 to FIG. 8, the array antenna 175c implemented on the side key circuit board 175 may use the through-hole 110a formed on the side surface of the housing 110 as an antenna aperture for transmitting/receiving radio waves of the array antenna 175c. Accordingly, the array antenna 175c may have a radiation pattern having directivity towards the outside of the electronic device 100 from the through-hole 110a. For example, a major lobe among radiation lobes of the array antenna 175c may be formed in a direction of a virtual center axis which is on the same line with the center of the through-hole 110a in the width direction of the electronic device 100.

In an embodiment, since the array antenna 175c is symmetric about the virtual center axis, the radiation pattern of the array antenna 175c may have a pattern substantially symmetric about the virtual center axis. In other words, the radiation lobes of the array antenna 175c may be substantially symmetric about the virtual center axis. For example, a radiation direction and radiation region of minor lobes among the radiation lobes may be substantially symmetric about the virtual center axis.

Figure 9:
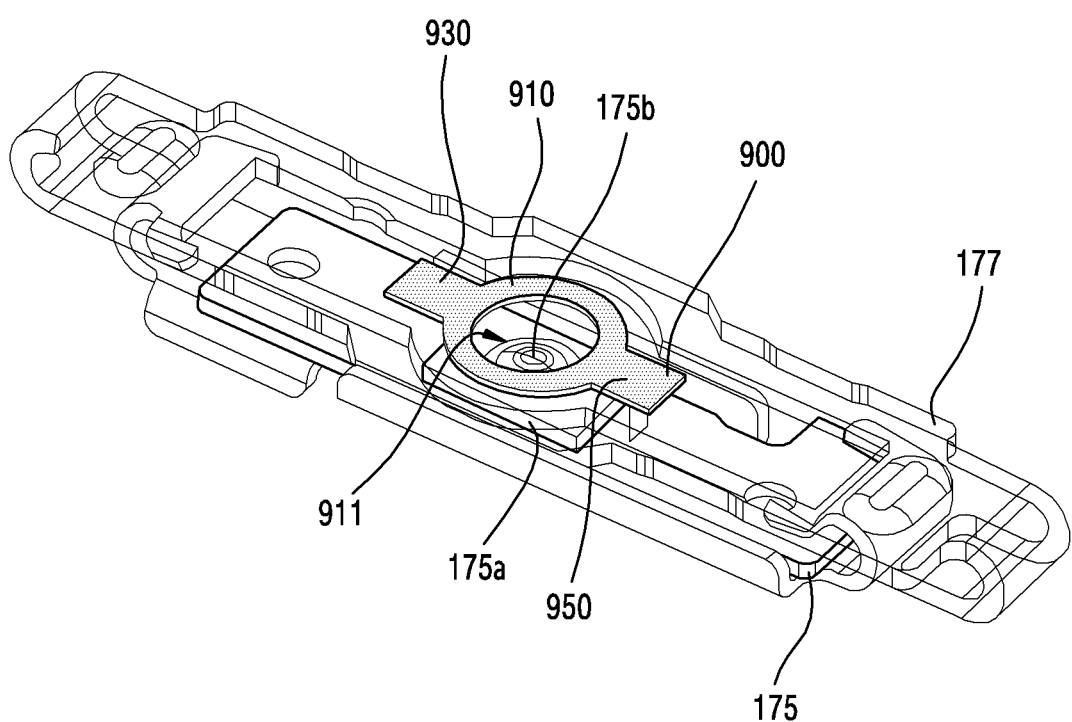
FIG. 9 is a drawing for explaining a side key including a patch antenna according to an embodiment of the disclosure.

FIG. 9 is a drawing for explaining a side key including a patch antenna according to an embodiment of the disclosure. Part of a structure of the side key of FIG. 9 may be the same as or similar to part of the structure of the side key of FIG. 3 to FIG. 5. Accordingly, descriptions on the same or similar structure as in FIG. 3 to FIG. 5 may be omitted in FIG. 9.

Referring to FIG. 9, the side key bracket 177 may provide a space in which the side key circuit board 175 can be seated, and may stably fix and support the side key circuit board 175. In addition, the side key circuit board 175 may include the switch module 175a and the outer contact portion 175b. The switch module 176a may be disposed to a center portion located on the same line with the center of the through-hole 110a formed on the side surface of the housing 110 in the width direction of the electronic device 100, and may have an inner contact portion included inside thereof to produce an electric signal (a key input signal) when the inner contact portion is in contact with the outer contact portion 175b. The outer contact portion 175b may be disposed on the switch module 175a or may be provided integrally with the switch module 175a, and may be disposed on the same line with the center of the through-hole 110a in a width direction of the electronic device 100 so as to be pressed by the actuation portion 173 of the side key 170. In an embodiment, the outer contact portion 175b may be provided in a dome shape.

The side key 170 may include a patch antenna 900. The patch antenna 900 may be disposed on or adjacent to a front surface of the side key circuit board 175. For example, the patch antenna 900 may be disposed on the front surface of the side key circuit board 175 to which the outer contact portion 175b is disposed. As another example, the patch antenna 900 may be spaced apart by a specific distance from the side key circuit board 175 to which the outer contact portion 175b is disposed and may be disposed between the side key circuit board 175 and the actuation portion 173.

The patch antenna 900 may include a center portion 910, a first extension portion 930, and a second extension portion 950. The center portion 910, the first extension portion 930, and the second extension portion 950 may be disposed substantially on the same plane.

The center portion 910 may be disposed on the same line with the center of the through-hole 110a in the width direction of the electronic device 100. According to an embodiment, the center portion 910 may include a through-hole 911 penetrating from a front surface to a back surface. The through-hole 911 may be located on the same line with the center of the through-hole 110a formed on the side surface of the housing 110 in the width direction of the electronic device 100. In addition, the through-hole 911 may be relatively larger in size than the outer contact portion 175b. For example, when the outer contact portion 175b is provided in a dome shape, a diameter of the through-hole 911 may be greater than a diameter of a dome of the outer contact portion 175b. In this case, the center portion 910 may be disposed in such a manner that the outer contact portion 175b is inserted to the through-hole 911. According to an embodiment, the center portion 910 may be provided in a circular shape in which the through-hole 911 is formed at a center thereof.

The first extension portion 930 and the second extension portion 950 may extend from respective side surfaces of the center portion 910. A direction in which the first extension portion 930 extends from the center portion 910 may be opposite to a direction in which the second extension portion 950 extends from the center portion 910. For example, the first extension portion 930 may extend in a left direction from a left side surface of the center portion 910, and the second extension portion 950 may extend in a right direction from a right side surface of the center portion 910. According to an embodiment, the first extension portion 930 may be symmetric to the second extension portion 950 about the center portion 910. For example, a length and width by which the first extension portion 930 extends in the left direction from the left side surface of the center portion 910 may be substantially identical to a length and width by which the second extension portion 930 extends in the right direction from the right side surface of the center portion 910.

The patch antenna 900 may be electrically coupled to a main printed circuit board disposed inside the housing 110. For example, the first extension portion 930 or the second extension portion 950 of the patch antenna 900 may be electrically coupled to a communication module mounted on the main printed circuit board through a connection terminal included in the side key circuit board 175.

Figure 10:
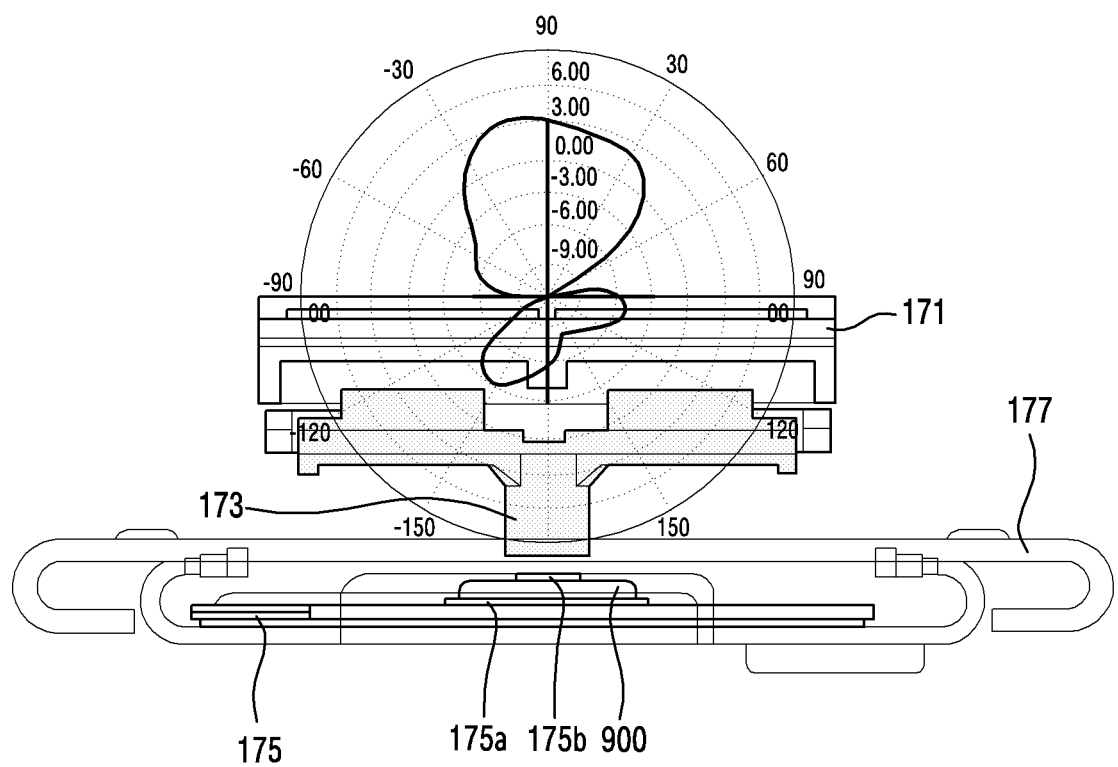
FIG. 10 is a plan view illustrating part of a structure of a side key for explaining a radiation pattern of a patch antenna included in the side key according to an embodiment of the disclosure.
Figure 11:
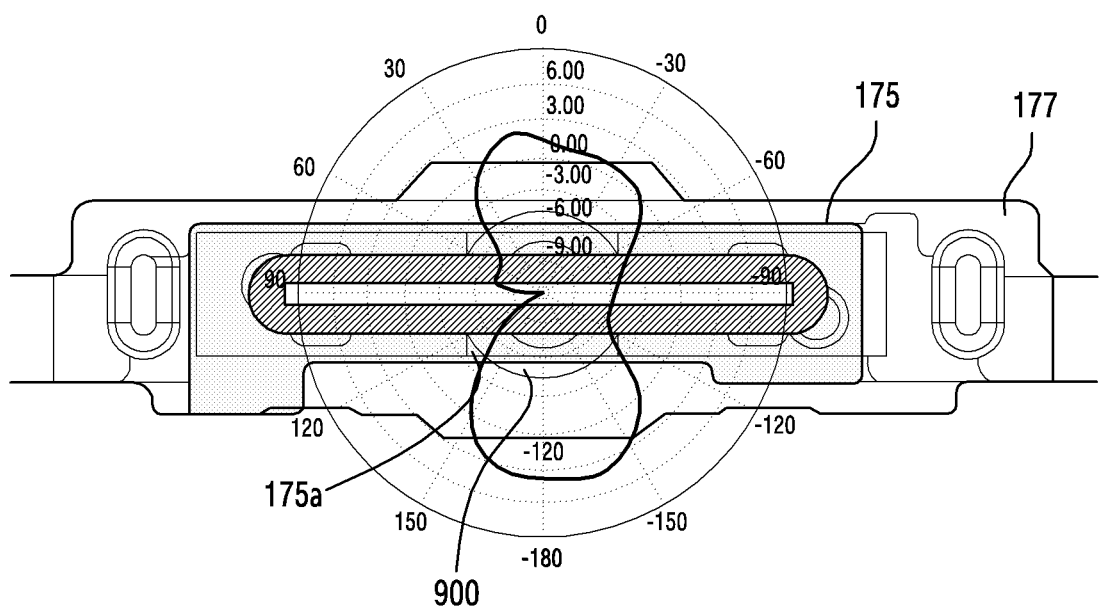
FIG. 11 is a front view illustrating part of a structure of a side key for explaining a radiation pattern of a patch antenna included in the side key according to an embodiment of the disclosure.
Figure 12:
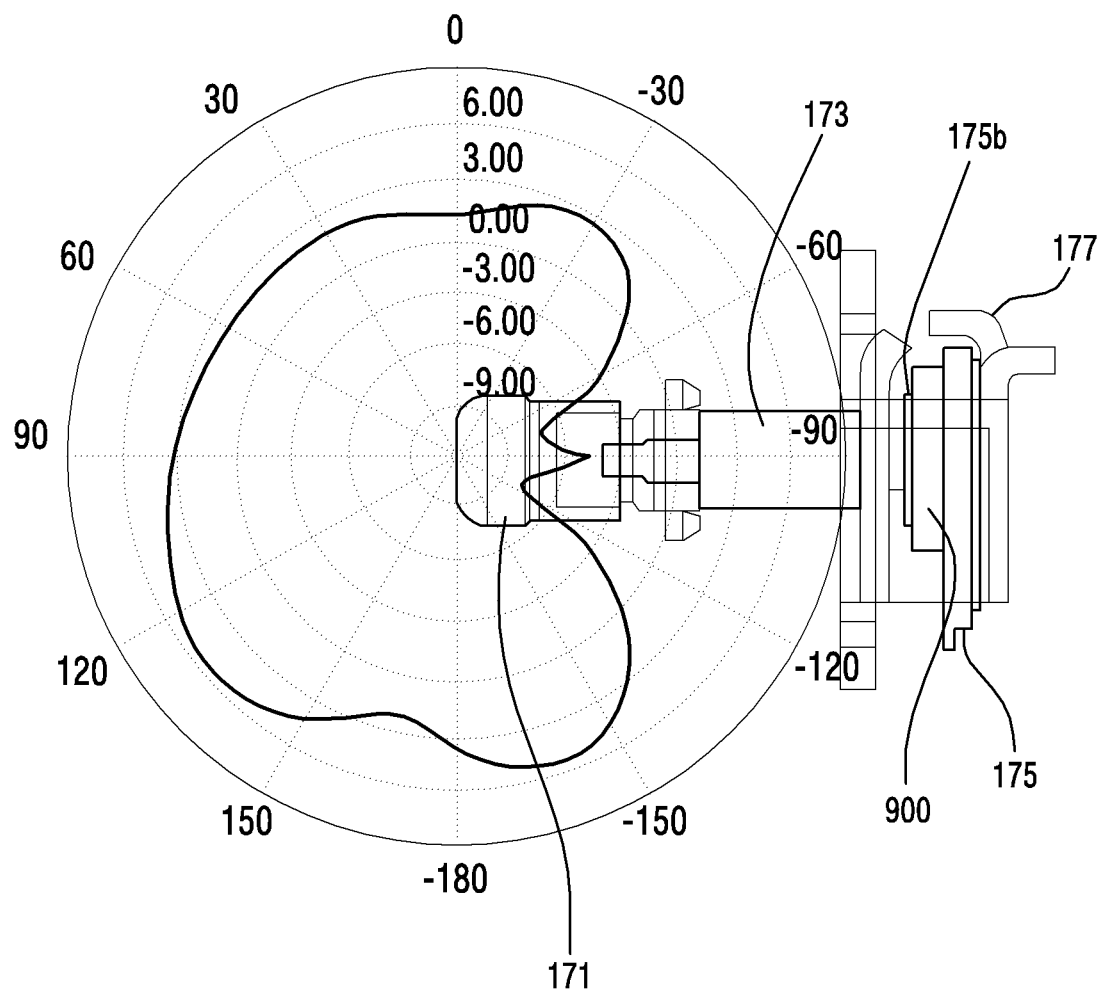
FIG. 12 is a lateral view illustrating part of a structure of a side key for explaining a radiation pattern of a patch antenna included in the side key according to an embodiment of the disclosure.

FIG. 10 is a plan view illustrating part of a structure of a side key for explaining a radiation pattern of a patch antenna included in the side key according to an embodiment of the disclosure. FIG. 11 is a front view illustrating part of a structure of a side key for explaining a radiation pattern of a patch antenna included in the side key according to an embodiment of the disclosure. FIG. 12 is a lateral view illustrating part of a structure of a side key for explaining a radiation pattern of a patch antenna included in the side key according to an embodiment of the disclosure.

Referring to FIG. 10 to FIG. 12, the patch antenna 900 disposed on or adjacent to the front surface of the side key circuit board 175 may use the through-hole 110a formed on the side surface of a housing 110 as an antenna aperture for transmitting/receiving radio waves of the patch antenna 900.

Accordingly, the patch antenna 900 may have a radiation pattern having directivity towards the outside of the electronic device 100 from the through-hole 110a. For example, a major lobe among radiation lobes of the patch antenna 900 may be formed in a direction of a virtual center axis which is on the same line with the center of the through-hole 911 formed at the center portion 910 of the patch antenna 900 and the center of the through-hole 110a formed on the side surface of the housing 110 in the width direction of the electronic device 100. In an embodiment, since the first extension portion 930 and the second extension portion 950 are symmetric about the center portion 910 in the patch antenna 900, the radiation pattern of the patch antenna 900 may have a pattern substantially symmetric about the virtual center axis.

Figure 13:
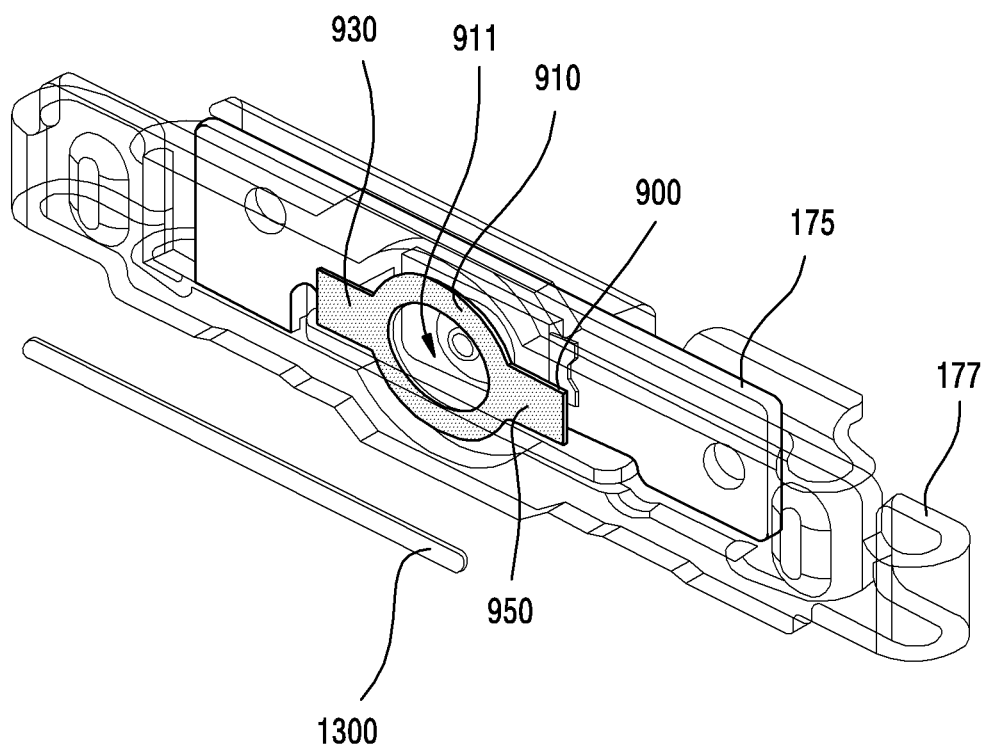
FIG. 13 illustrates a side key including a director according to an embodiment of the disclosure.

FIG. 13 illustrates a side key including a director according to an embodiment of the disclosure.

Referring to FIG. 13, the side key 170 may include a director 1300. The director 1300 may serve to increase a directivity and radiation gain for a radiation pattern of an antenna included in the side key 170. Although a state where the director 1300 is used for the directivity and radiation gain for the radiation pattern of the patch antenna 900 included in the side key 170 is shown in FIG. 13, without being limited thereto, the director 1300 may be used for the directivity and radiation gain for the radiation pattern of the array antenna 175c shown in FIG. 3 to FIG. 5.

The director 1300 may include a conductor, and may be disposed on a front surface of the antenna. According to an embodiment, the director 1300 may be disposed inside the button portion 171 of the side key 170, inside the actuation portion 173 of the side key 170, or between the button portion 171 and the actuation portion 173. The director 1300 may be provided in a shape of a belt of which a length is longer than a width. In addition, the director 1300 may be disposed such that a length direction thereof is in parallel with a length direction of the side key circuit board 175.

Figure 14:
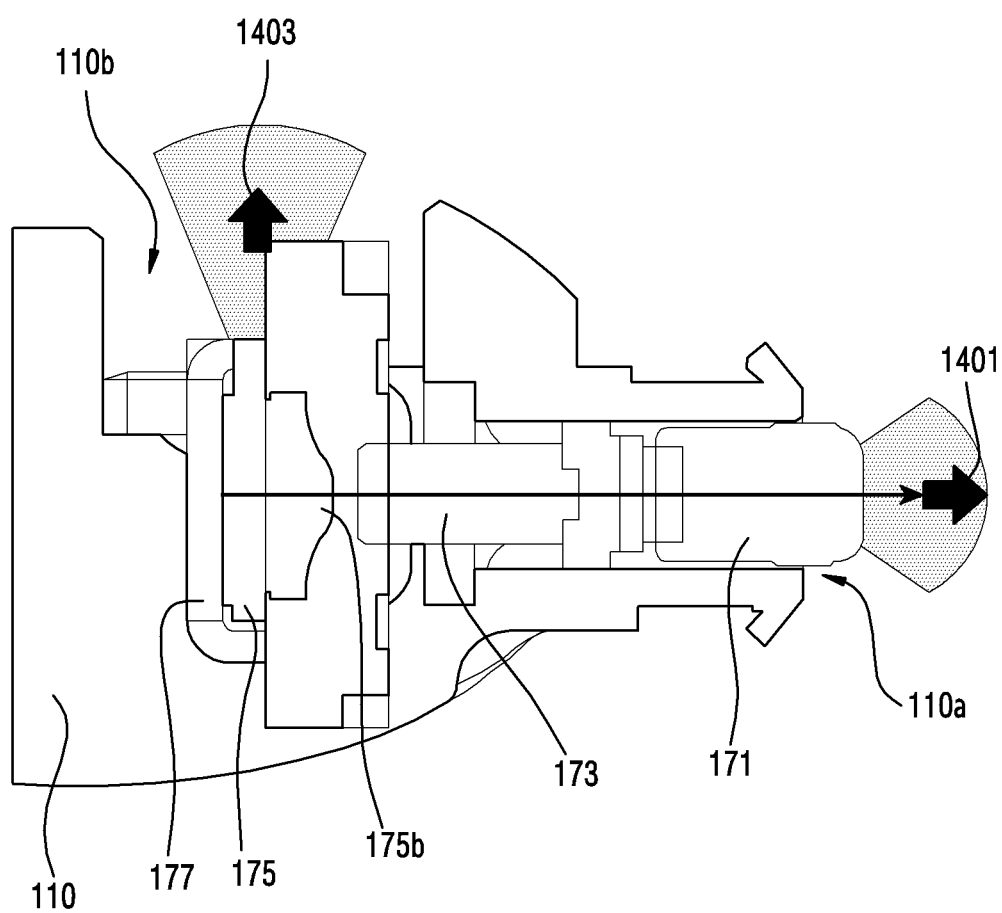
FIG. 14 is a drawing for explaining a null problem in a radiation pattern of an antenna included in a side key according to an embodiment of the disclosure.

FIG. 14 is a drawing for explaining a null problem in a radiation pattern of an antenna included in a side key according to an embodiment of the disclosure.

Referring to FIG. 14, the housing 110 of the electronic device 100 may have an opening portion 110b formed to place the side key 170. For example, the housing 110 may have the opening portion 110b provided to place the side key 170 on a surface (e.g., a front surface) facing the front cover 130 of the electronic device 100. Accordingly, the side key 170 may be placed by being inserted to a lower end in a width direction of the electronic device 100 through the opening portion 110b.

The through-hole 110a formed on the side surface of the housing 110 to operate the side key 170 and the opening portion 110b formed on the front surface of the housing 110 to place the side key 170 may be used as an aperture of an antenna (e.g., the array antenna 175c or the patch antenna 900) included in the side key 170. For example, as shown in FIG. 14, radio waves to be transmitted/received through the antenna included in the side key 170 may be radiated in an outward direction 1401 of the housing 110 through the through-hole 110a formed on the side surface of the housing 110, and may be radiated in a forward direction 1403 of the housing 110 through the opening portion 110b formed on the front surface of the housing 110. Accordingly, the radiation pattern of the antenna may produce a null region in the entire beam pattern due to a phase difference of two radio waves radiated through the through-hole 110a and the opening portion 110b, and the null region may cause a problem in that coverage intensity of the antenna deteriorates.

In order to solve this problem, the disclosure may apply a shielding structure which covers at least some regions of the opening portion 110b. The shielding structure will be described in detail with reference to FIG. 15 and FIG. 16.

Figure 15:
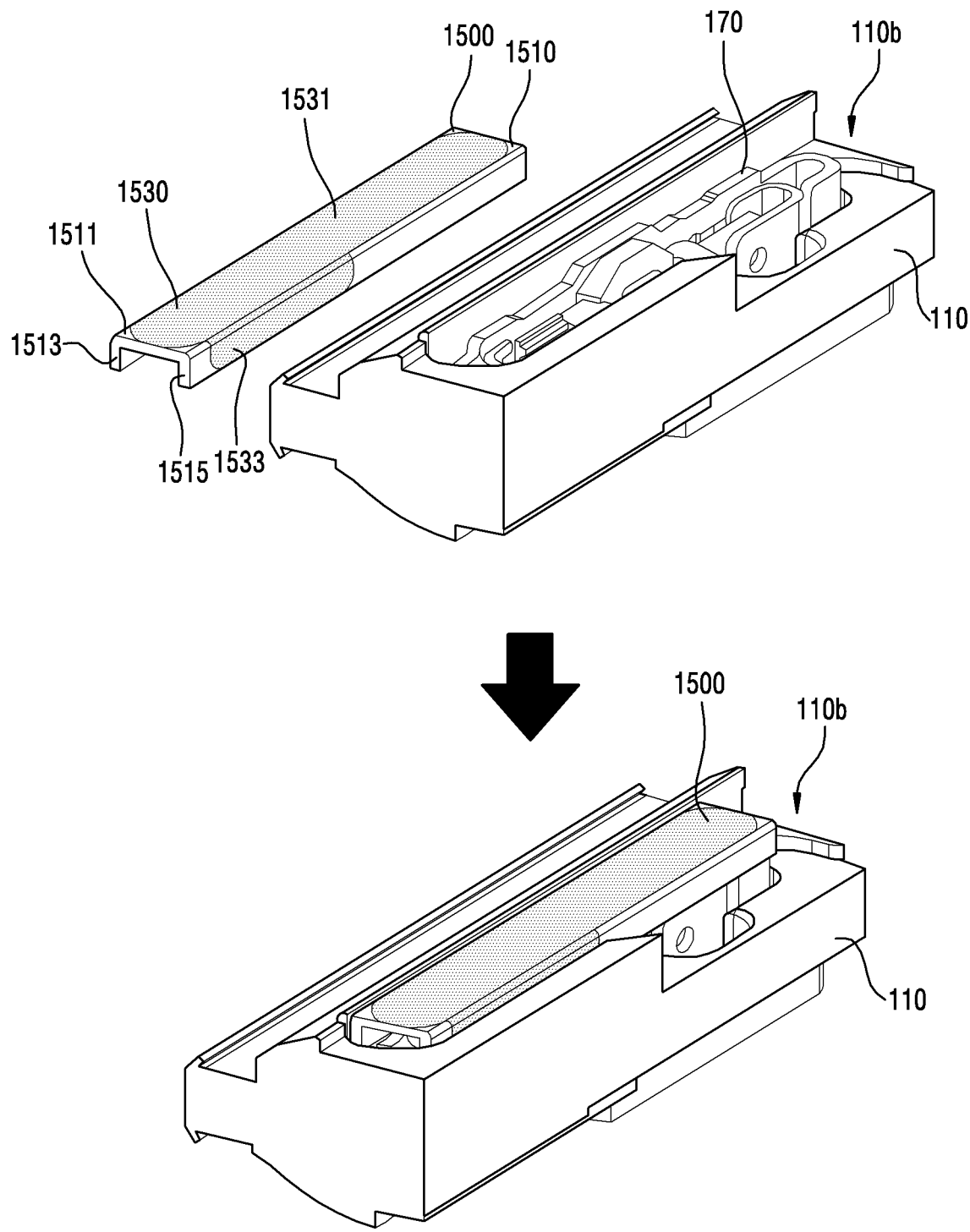
FIG. 15 illustrates a method in which a shielding structure of an antenna is applied to a side key according to an embodiment of the disclosure.
Figure 16:
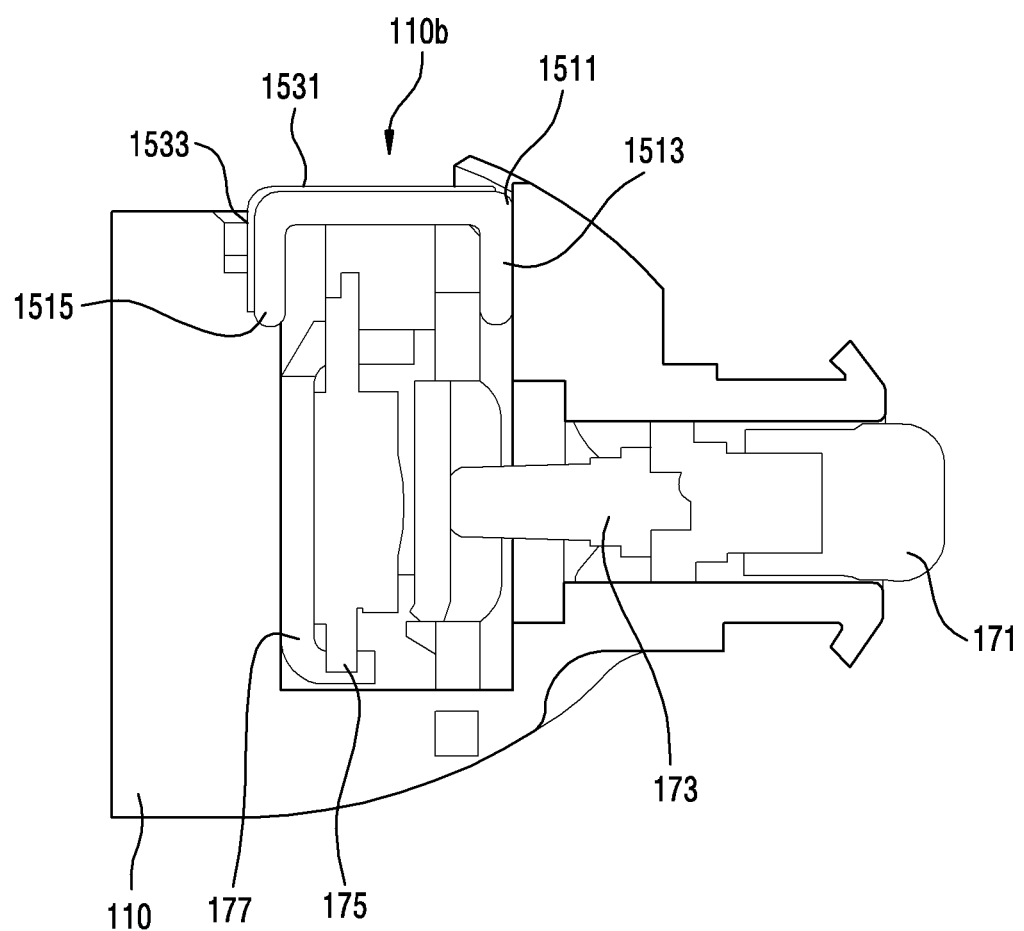
FIG. 16 illustrates a shielding structure of an antenna applied to a side key according to an embodiment of the disclosure.

FIG. 15 illustrates a method in which a shielding structure of an antenna is applied to a side key according to an embodiment of the disclosure. FIG. 16 illustrates a shielding structure of an antenna applied to a side key according to an embodiment of the disclosure.

Referring to FIG. 15 and FIG. 16, the housing 110 of the electronic device 100 may have the opening portion 110b to place the side key 170. For example, in the housing 110, the opening portion 110b for placing the side key 170 may be provided on a surface (e.g., a front surface) facing the front cover 130 of the electronic device 100. Since the opening portion 110b may be used as an unnecessary aperture of an antenna (e.g., the array antenna 175c or the patch antenna 900) included in the side key 170, a shielding structure which covers at least some regions of the opening portion 110b may be applied to the side key 170. For example, the side key 170 may include a shielding member 1500.

The shielding member 1500 may be disposed to cover at least some regions of the opening portion 110b. The shielding member 1500 may include a fastening frame 1510 and a shielding layer 1530. The fastening frame 1510 may provide stable fastening to the opening portion 110b when covering the opening portion 110b, and the shielding layer 1530 may shield radio waves.

The fastening frame 1510 may include a first frame 1511, a second frame 1513, and a third frame 1515. The first frame 1511 may be disposed in parallel with the front surface of the housing 110, and may be provided with a size corresponding to a size of the opening portion 110b to cover the opening portion 110b. For example, a length of the first frame 1511 may be substantially equal to a length of the opening portion 110b, and a width of the first frame 1511 may be substantially equal to a width of the opening portion 110b.

The second frame 1513 and the third frame 1515 may allow the fastening frame 1510 to be stably fixed to the opening portion 110b. For example, the second frame 1513 and the third frame 1515 may extend respectively from both side surfaces of the first frame 1511 and may be bent in a backward direction of the housing 110, thereby being inserted along both lateral walls of the opening portion 110b. Accordingly, the fastening frame 1510 may be engaged with the opening portion 110b. The second frame 1513 may extend from one side surface of the first frame 1511 and may be bent in the backside direction of the housing 110, thereby being inserted to the opening portion 110b along one lateral wall thereof, and the third frame 1515 may extend from another side surface of the first frame 1511 and may be bent in the backside direction of the housing 110, thereby being inserted to the opening portion 110b along another lateral wall thereof. The second frame 1513 and the third frame 1515 may be disposed to face each other.

The shielding layer 1530 may include a shielding portion 1531 and a short-circuit portion 1533. The shielding portion 1531 may include a conductor, and may be attached to a front surface of the first frame 1511. The shielding portion 1531 may be provided with a size equal to or relatively smaller than a size of the opening portion 110b. For example, a length of the shielding portion 1531 may be substantially equal to a length of the opening portion 110b, and a width of the shielding portion 1531 may be substantially equal to a width of the opening portion 110b. In this case, the shielding portion 1531 may shield most of radio waves radiated from the opening portion 110b. As another example, the length of the shielding portion 1531 may be relatively smaller than the length of the opening portion 110*b*, and the width of the shielding portion 1531 may be relatively smaller than the width of the opening portion 110*b*. In this case, the shielding portion 1531 may shield part of radio waves radiated from the opening portion 110*b*, and a length and width thereof may be formed to shield the radio waves radiated from an important portion (e.g., a portion close to an inner side of the housing 110) in which a null region is produced.

The short-circuit portion 1533 may include a conductor, and may extend from the shielding portion 1531 and be connected to a ground region of the electronic device 100. The short-circuit portion 1533 may be attached to the second frame 1513 or the third frame 1515. It is shown in FIG. 15 and FIG. 16 that the short-circuit portion 1531 is attached to the third frame 1515.

Figure 17:
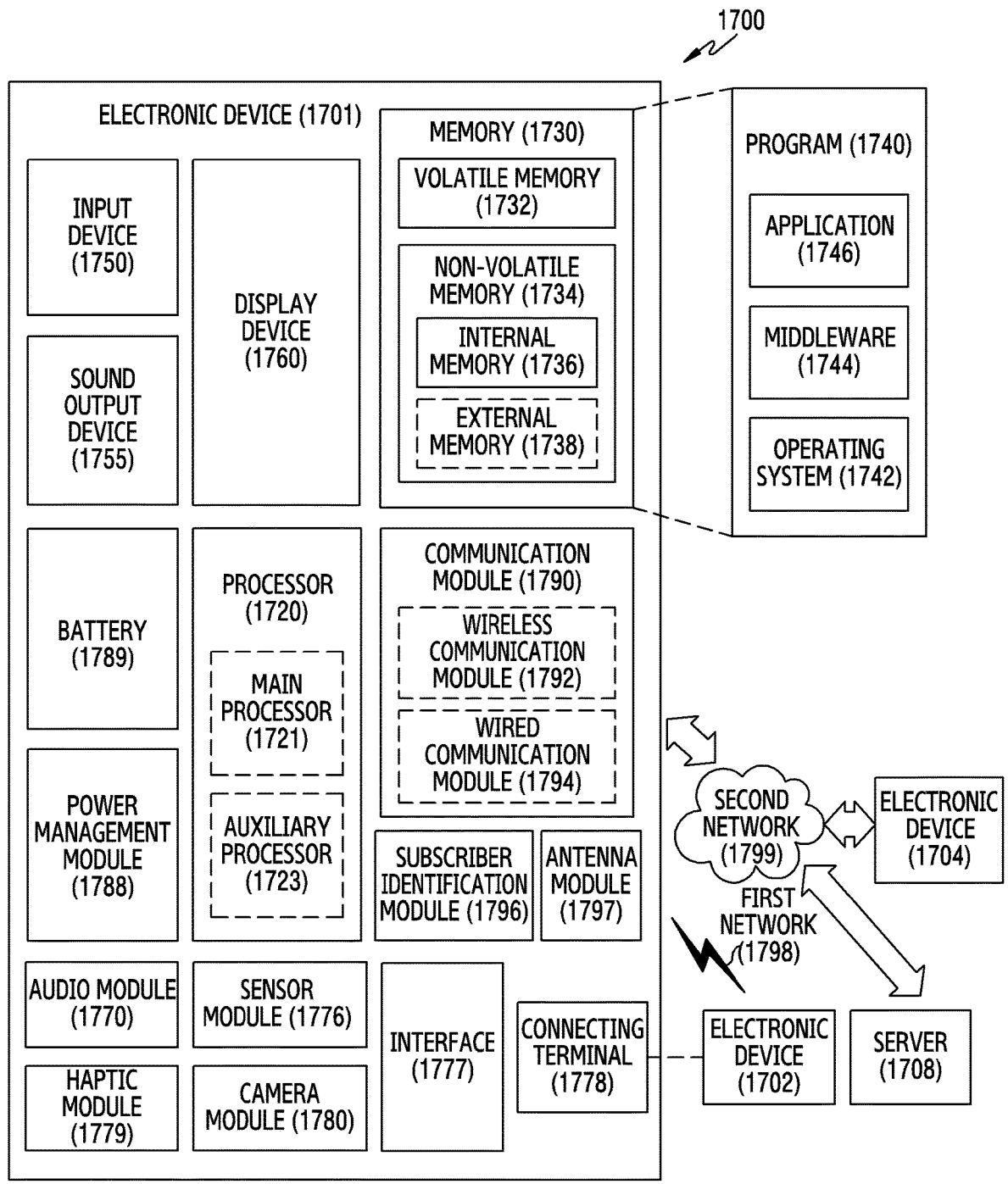
FIG. 17 is a block diagram of an electronic device in a network environment according to various embodiments.

As described above, according to various embodiments, an electronic device (e.g., the electronic device 100, the electronic device 1701 of FIG. 17) may include a conductive housing (e.g., the housing 110) including a first surface facing a first direction, a second surface facing a second direction opposite to the first direction, and a side surface surrounding at least part of a space between the first surface and the second surface, a printed circuit board seated inside the housing, and a side key (e.g., the side key 170) fastened to an edge region of the housing. The side key may include a button portion (e.g., the button portion 171) of which one surface covers a first through-hole (e.g., the through-hole 110*a*) formed on the side surface and another surface is exposed to the outside, an actuation portion (e.g., the actuation portion 173) extending from the surface of the button portion covering the first through-hole towards the inside of the housing in such a manner that at least part of the extending portion is inserted to the first through-hole and at least part of the inserted portion moves in a third direction parallel to a normal direction of the side surface of the housing according to whether the button portion is pressed, a side key circuit board (e.g., the side key circuit board 175) including an outer contact portion (e.g., the outer contact portion 175*b*) pressed by a movement of the actuation portion, an inner contact portion which is in contact with the outer contact portion according to whether the outer contact portion is pressed, and a switch module (e.g., the switch module 175*a*) which produces an electric signal due to the contact of the outer contact portion and the inner contact portion, a side key bracket (e.g., the side key bracket 177) on which at least part of the side key circuit board is seated and which fixes and supports the side key circuit board, and an antenna (e.g., the array antenna 175*c* or the patch antenna 900) which uses the first through-hole as an antenna aperture for transmitting and receiving radio waves.

According to various embodiments, the antenna may include an array antenna (e.g., the array antenna 175*c*) formed on the side key circuit board.

According to various embodiments, the array antenna may include a plurality of antenna elements (e.g., the radiator 175*c*-2) being symmetric about a virtual center axis which is on the same line with a center of the first through-hole in the third direction.

According to various embodiments, a feeding portion (e.g., the feeding portion 175*c*-1) of at least one first antenna element, among the plurality of antenna elements, located in a left direction with respect to the virtual center axis may be disposed to a left side of the at least one first antenna element. A feeding portion (e.g., the feeding portion 175*c*-1) of at least one second antenna element, among the plurality of antenna elements, located in a right direction with respect to the virtual center axis may be disposed to a right side of the at least one second antenna element.

According to various embodiments, in the outer contact portion, a surface facing the inner contact portion may include a hemispherical surface protruding towards the first through-hole. A center portion of the hemispherical surface may be in contact with the inner contact portion by being pressed towards the inner contact portion. A center of the outer contact portion may be located on the virtual center axis.

According to various embodiments, the antenna may be disposed on one surface of the side key circuit board having the outer contact portion disposed thereon, or may include a patch antenna (e.g., the patch antenna 900) spaced apart by a specific distance from the side key circuit board and disposed between the side key circuit board and the actuation portion.

According to various embodiments, the patch antenna may include a center portion (e.g., the center portion 910) located on a virtual center axis which is on the same line with a center of the first through-hole in the third direction, including a second through-hole (e.g., the through-hole 911) penetrating from a third surface facing the side key circuit board to a fourth surface opposite to the third surface, and disposed in parallel with the first surface, a first extension portion (e.g., the first extension portion 930) disposed on the same plane as the center portion and extending from one side surface of the center portion in a fourth direction perpendicular to the third direction, and a second extension portion (e.g., the second extension portion 950) disposed on the same plane as the center portion and extending from another side surface of the center portion in a fifth direction opposite to the fourth direction. The first extension portion and the second extension portion may be symmetric about the center portion.

According to various embodiments, the outer contact portion may include a hemispherical surface formed in such a manner that a surface facing the inner contact portion protrudes towards the through-hole, and may be in contact with the inner contact portion in such a manner that a center portion of the hemispherical surface is pressed towards the inner contact portion. A center of the outer contact portion may be located on the virtual center axis.

According to various embodiments, the second through-hole may be located on the virtual center axis and have a diameter relatively greater than a diameter of the hemispherical surface of the outer contact point-portion. The outer contact portion may be disposed by being inserted to the second through-hole.

According to various embodiments, the center portion may be provided in a circular shape in which the second through-hole is formed at a center thereof.

According to various embodiments, the electronic device may further include a conductor (e.g., the director 1300) disposed on a surface on which the antenna faces the actuation portion.

According to various embodiments, the conductor may be disposed inside the button portion, inside the actuation portion, or between the button portion and the actuation portion.

According to various embodiments, the conductor may be provided in a shape of a belt of which a length is longer than a width, and may be disposed such that a length direction thereof is in parallel with a length direction of the side key circuit board perpendicular to the third direction.

According to various embodiments, the electronic device may further include an opening portion (e.g., the opening portion 110b) which is open in a direction from the first surface to the second surface to place the side key, and a shielding member (e.g., the shielding member 1500) configured to shield radio waves radiated from the opening portion. The shielding member may include a fastening frame (e.g., the fastening frame 1510) which covers the opening portion, and a shielding layer (e.g., the shielding layer 1530) attached on the fastening frame and including a conductor.

According to various embodiments, the fastening frame may include a first frame (e.g., the first frame 1511) disposed in parallel with the first surface and provided with a size corresponding to a size of the opening portion to cover the opening portion, a second frame (e.g., the second frame 1513) extending from one side surface of the first frame, bent towards the second surface, and inserted along one lateral wall of the opening portion, and a third frame (e.g., the third frame 1515) extending from another side surface of the first frame, bent towards the second surface, and inserted along another lateral wall of the opening portion.

According to various embodiments, the second frame and the third frame may be disposed to face each other.

According to various embodiments, the shielding layer may include a shielding portion (e.g., the shielding portion 1531) provided with a size equal to or smaller than a size of the opening portion and attached to one surface of the first frame, and a short-circuit portion (e.g., the short-circuit portion 1533) extending from the shielding portion and connected to a ground region of the printed circuit board.

According to various embodiments, the shift-circuit portion may be attached on one surface of the second frame or third frame.

According to various embodiments, the side key bracket may include a pair of support portions provided in a shape of a plate with a size corresponding to a size of the side key circuit board, and disposed to face each other by being spaced apart by a specific distance. The side key circuit board may include a first part seated by being inserted to a space in which the support portions are spaced apart from each other and a second part extending from the first part towards the inside of the housing and coupled to the printed circuit board.

According to various embodiments, the side key bracket may further include a protrusion portion extending from a side surface of any one of the support portions and bent towards another support portion to extend by a specific length.

FIG. 17 is a block diagram illustrating an electronic device 1701 in a network environment 1700 according to various embodiments.

Referring to FIG. 17, the electronic device 1701 in the network environment 1700 may communicate with an electronic device 1702 via a first network 1798 (e.g., a short-range wireless communication network), or an electronic device 1704 or a server 1708 via a second network 1799 (e.g., a long-range wireless communication network). According to an embodiment, the electronic device 1701 may communicate with the electronic device 1704 via the server 1708. According to an embodiment, the electronic device 1701 may include a processor 1720, memory 1730, an input device 1750, a sound output device 1755, a display device 1760, an audio module 1770, a sensor module 1776, an interface 1777, a haptic module 1779, a camera module 1780, a power management module 1788, a battery 1789, a communication module 1790, a subscriber identification module (SIM) 1796, or an antenna module 1797. In some embodiments, at least one (e.g., the display device 1760 or the camera module 1780) of the components may be omitted from the electronic device 1701, or one or more other components may be added in the electronic device 1701. In some embodiments, some of the components may be implemented as single integrated circuitry. For example, the sensor module 1776 (e.g., a fingerprint sensor, an iris sensor, or an illuminance sensor) may be implemented as embedded in the display device 1760 (e.g., a display).

The processor 1720 may execute, for example, software (e.g., a program 1740) to control at least one other component (e.g., a hardware or software component) of the electronic device 1701 coupled with the processor 1720, and may perform various data processing or computation. According to one embodiment, as at least part of the data processing or computation, the processor 1720 may load a command or data received from another component (e.g., the sensor module 1776 or the communication module 1790) in volatile memory 1732, process the command or the data stored in the volatile memory 1732, and store resulting data in non-volatile memory 1734. According to an embodiment, the processor 1720 may include a main processor 1721 (e.g., a central processing unit (CPU) or an application processor (AP)), and an auxiliary processor 1723 (e.g., a graphics processing unit (GPU), an image signal processor (ISP), a sensor hub processor, or a communication processor (CP)) that is operable independently from, or in conjunction with, the main processor 1721. Additionally or alternatively, the auxiliary processor 1723 may be adapted to consume less power than the main processor 1721, or to be specific to a specified function. The auxiliary processor 1723 may be implemented as separate from, or as part of the main processor 1721.

The auxiliary processor 1723 may control at least some of functions or states related to at least one component (e.g., the display device 1760, the sensor module 1776, or the communication module 1790) among the components of the electronic device 1701, instead of the main processor 1721 while the main processor 1721 is in an inactive (e.g., sleep) state, or together with the main processor 1721 while the main processor 1721 is in an active state (e.g., executing an application). According to an embodiment, the auxiliary processor 1723 (e.g., an image signal processor or a communication processor) may be implemented as part of another component (e.g., the camera module 1780 or the communication module 1790) functionally related to the auxiliary processor 1723.

The memory 1730 may store various data used by at least one component (e.g., the processor 1720 or the sensor module 1776) of the electronic device 1701. The various data may include, for example, software (e.g., the program 1740) and input data or output data for a command related thereto. The memory 1730 may include the volatile memory 1732 or the non-volatile memory 1734.

The program 1740 may be stored in the memory 1730 as software, and may include, for example, an operating system (OS) 1742, middleware 1744, or an application 1746.

The input device 1750 may receive a command or data to be used by other component (e.g., the processor 1720) of the electronic device 1701, from the outside (e.g., a user) of the electronic device 1701. The input device 1750 may include, for example, a microphone, a mouse, a keyboard, or a digital pen (e.g., a stylus pen).

The sound output device 1755 may output sound signals to the outside of the electronic device 1701. The sound output device 1755 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1760 may visually provide information to the outside (e.g., a user) of the electronic device 1701. The display device 1760 may include, for example, a display, a hologram device, or a projector and control circuitry to control a corresponding one of the display, hologram device, and projector. According to an embodiment, the display device 1760 may include touch circuitry adapted to detect a touch, or sensor circuitry (e.g., a pressure sensor) adapted to measure the intensity of force incurred by the touch.

The audio module 1770 may convert a sound into an electrical signal and vice versa. According to an embodiment, the audio module 1770 may obtain the sound via the input device 1750, or output the sound via the sound output device 1755 or a headphone of an external electronic device (e.g., an electronic device 1702) directly (e.g., wiredly) or wirelessly coupled with the electronic device 1701.

The sensor module 1776 may detect an operational state (e.g., power or temperature) of the electronic device 1701 or an environmental state (e.g., a state of a user) external to the electronic device 1701, and then generate an electrical signal or data value corresponding to the detected state. According to an embodiment, the sensor module 1776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1777 may support one or more specified protocols to be used for the electronic device 1701 to be coupled with the external electronic device (e.g., the electronic device 1702) directly (e.g., wiredly) or wirelessly. According to an embodiment, the interface 1777 may include, for example, a high definition multimedia interface (HDMI), a universal serial bus (USB) interface, a secure digital (SD) card interface, or an audio interface.

A connecting terminal 1778 may include a connector via which the electronic device 1701 may be physically connected with the external electronic device (e.g., the electronic device 1702). According to an embodiment, the connecting terminal 1778 may include, for example, a HDMI connector, a USB connector, a SD card connector, or an audio connector (e.g., a headphone connector).

The haptic module 1779 may convert an electrical signal into a mechanical stimulus (e.g., a vibration or a movement) or electrical stimulus which may be recognized by a user via his tactile sensation or kinesthetic sensation. According to an embodiment, the haptic module 1779 may include, for example, a motor, a piezoelectric element, or an electric stimulator.

The camera module 1780 may capture a still image or moving images. According to an embodiment, the camera module 1780 may include one or more lenses, image sensors, image signal processors, or flashes.

The power management module 1788 may manage power supplied to the electronic device 1701. According to one embodiment, the power management module 1788 may be implemented as at least part of, for example, a power management integrated circuit (PMIC).

The battery 1789 may supply power to at least one component of the electronic device 1701. According to an embodiment, the battery 1789 may include, for example, a primary cell which is not rechargeable, a secondary cell which is rechargeable, or a fuel cell.

The communication module 1790 may support establishing a direct (e.g., wired) communication channel or a wireless communication channel between the electronic device 1701 and the external electronic device (e.g., the electronic device 1702, the electronic device 1704, or the server 1708) and performing communication via the established communication channel. The communication module 1790 may include one or more communication processors that are operable independently from the processor 1720 (e.g., the application processor (AP)) and supports a direct (e.g., wired) communication or a wireless communication. According to an embodiment, the communication module 1790 may include a wireless communication module 1792 (e.g., a cellular communication module, a short-range wireless communication module, or a global navigation satellite system (GNSS) communication module) or a wired communication module 1794 (e.g., a local area network (LAN) communication module or a power line communication (PLC) module). A corresponding one of these communication modules may communicate with the external electronic device via the first network 1798 (e.g., a short-range communication network, such as Bluetooth™, wireless-fidelity (Wi-Fi) direct, or infrared data association (IrDA)) or the second network 1799 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1792 may identify and authenticate the electronic device 1701 in a communication network, such as the first network 1798 or the second network 1799, using subscriber information (e.g., international mobile subscriber identity (IMSI)) stored in the subscriber identification module 1796.

The antenna module 1797 may transmit or receive a signal or power to or from the outside (e.g., the external electronic device) of the electronic device 1701. According to an embodiment, the antenna module 1797 may include an antenna including a radiating element composed of a conductive material or a conductive pattern formed in or on a substrate (e.g., PCB). According to an embodiment, the antenna module 1797 may include a plurality of antennas. In such a case, at least one antenna appropriate for a communication scheme used in the communication network, such as the first network 1798 or the second network 1799, may be selected, for example, by the communication module 1790 (e.g., the wireless communication module 1792) from the plurality of antennas. The signal or the power may then be transmitted or received between the communication module 1790 and the external electronic device via the selected at least one antenna. According to an embodiment, another component (e.g., a radio frequency integrated circuit (RFIC)) other than the radiating element may be additionally formed as part of the antenna module 1797.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1701 and the external electronic device 1704 via the server 1708 coupled with the second network 1799. Each of the electronic devices 1702 and 1704 may be a device of a same type as, or a different type, from the electronic device 1701. According to an embodiment, all or some of operations to be executed at the electronic device 1701 may be executed at one or more of the external electronic devices 1702, 1704, or 1708. For example, if the electronic device 1701 should perform a function or a service automatically, or in response to a request from a user or another device, the electronic device 1701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1701. The electronic device 1701 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1740) including one or more instructions that are stored in a storage medium (e.g., internal memory 1736 or external memory 1738) that is readable by a machine (e.g., the electronic device 1701). For example, a processor (e.g., the processor 1720) of the machine (e.g., the electronic device 1701) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:
1. An electronic device comprising:
a conductive housing comprising a first surface facing a first direction, a second surface facing a second direction opposite to the first direction, and a side surface surrounding at least part of a space between the first surface and the second surface;
a printed circuit board seated inside the housing; and
a side key fastened to an edge region of the housing, wherein the side key comprises:
a button portion of which one surface covers a first through-hole formed on the side surface and the other surface is exposed to the outside;

an actuation portion extending from the surface of the button portion covering the first through-hole towards the inside of the housing in such a manner that at least part of the extending portion is inserted to the first through-hole and at least part of the inserted portion moves in a third direction parallel to a normal direction of the side surface of the housing according to whether the button portion is pressed;

a side key circuit board comprising an outer contact portion pressed by a movement of the actuation portion, an inner contact portion which is in contact with the outer contact portion according to whether the outer contact portion is pressed, and a switch module which produces an electric signal due to the contact of the outer contact portion and the inner contact portion;

a side key bracket on which at least part of the side key circuit board is seated and which fixes and supports the side key circuit board; and an antenna which uses the first through-hole as an antenna aperture for transmitting and receiving radio waves, wherein the antenna is disposed on one surface of the side key circuit board having the outer contact portion disposed thereon, or comprises a patch antenna spaced apart by a specific distance from the side key circuit board and disposed between the side key circuit board and the actuation portion, wherein the patch antenna comprises:
 a center portion located on a virtual center axis which is on the same line with a center of the first through-hole in the third direction, comprising a second through-hole penetrating from a third surface facing the side key circuit board to a fourth surface opposite to the third surface, and disposed in parallel with the first surface;
 a first extension portion disposed on the same plane as the center portion and extending from one side surface of the center portion in a fourth direction perpendicular to the third direction; and
 a second extension portion disposed on the same plane as the center portion and extending from another side surface of the center portion in a fifth direction opposite to the fourth direction, and
wherein the first extension portion and the second extension portion are symmetric about the center portion.

2. The electronic device of claim 1, wherein the antenna comprises an array antenna formed on the side key circuit board.

3. The electronic device of claim 2, wherein the array antenna comprises a plurality of antenna elements being symmetric about a virtual center axis which is on the same line with a center of the first through-hole in the third direction.

4. The electronic device of claim 3, wherein a feeding portion of at least one first antenna element, among the plurality of antenna elements, located in a left direction with respect to the virtual center axis is disposed to a left side of the at least one first antenna element, and a feeding portion of at least one second antenna element, among the plurality of antenna elements, located in a right direction with respect to the virtual center axis is disposed to a right side of the at least one second antenna element.

5. The electronic device of claim 3, wherein in the outer contact portion, a surface facing the inner contact portion comprises a hemispherical surface protruding towards the first through-hole, a center portion of the hemispherical surface is in contact with the inner contact portion by being pressed towards the inner contact portion, and a center of the outer contact portion is located on the virtual center axis.

6. The electronic device of claim 1,
wherein the outer contact portion comprises a hemispherical surface formed in such a manner that a surface facing the inner contact portion protrudes towards the through-hole, and is in contact with the inner contact portion in such a manner that a center portion of the hemispherical surface is pressed towards the inner contact portion, and
wherein a center of the outer contact portion is located on the virtual center axis.

7. The electronic device of claim 6,
wherein the second through-hole is located on the virtual center axis and has a diameter relatively greater than a diameter of the hemispherical surface of the outer contact portion, and
wherein the outer contact portion is disposed by being inserted to the second through-hole.

8. The electronic device of claim 1, wherein the center portion is provided in a circular shape in which the second through-hole is formed at a center thereof.

9. The electronic device of claim 1, further comprising a conductor disposed on a surface on which the antenna faces the actuation portion.

10. The electronic device of claim 9, wherein the conductor is disposed inside the button portion, inside the actuation portion, or between the button portion and the actuation portion.

11. The electronic device of claim 9, wherein the conductor is provided in a shape of a belt of which a length is longer than a width, and is disposed such that a length direction thereof is in parallel with a length direction of the side key circuit board perpendicular to the third direction.

12. The electronic device of claim 1, further comprising:
an opening portion which is open in a direction from the first surface to the second surface to place the side key; and
a shielding member configured to shield radio waves radiated from the opening portion,
wherein the shielding member comprises:
 a fastening frame which covers the opening portion; and
 a shielding layer attached on the fastening frame and comprising a conductor.

13. The electronic device of claim 12, wherein the fastening frame comprises:
a first frame disposed in parallel with the first surface and provided with a size corresponding to a size of the opening portion to cover the opening portion;
a second frame extending from one side surface of the first frame, bent towards the second surface, and inserted along one lateral wall of the opening portion; and
a third frame extending from another side surface of the first frame, bent towards the second surface, and inserted along another lateral wall of the opening portion.

14. The electronic device of claim 13, wherein the second frame and the third frame are disposed to face each other.

15. The electronic device of claim 13, wherein the shielding layer comprises:
a shielding portion provided with a size equal to or smaller than a size of the opening portion and attached to one surface of the first frame; and a short-circuit portion extending from the shielding portion and connected to a ground region of the printed circuit board.

16. The electronic device of claim 15, wherein the short-circuit portion is attached on one surface of the second frame or third frame.

17. The electronic device of claim 1,
wherein the side key bracket comprises a pair of support portions provided in a shape of a plate with a size corresponding to a size of the side key circuit board, and disposed to face each other by being spaced apart by a specified distance, and
wherein the side key circuit board comprises:
a first part seated by being inserted to a space in which the support portions are spaced apart from each other; and
a second part extending from the first part towards the inside of the housing and coupled to the printed circuit board.

18. The electronic device of claim 17, wherein the side key bracket further comprises a protrusion portion extending from a side surface of any one of the support portions and bent towards another support portion to extend by a specific length.

* * * * *